US008176460B2

(12) United States Patent
Boselli et al.

(10) Patent No.: US 8,176,460 B2
(45) Date of Patent: May 8, 2012

(54) METHOD OF OPTIMIZING ESD PROTECTION FOR AN IC, AN ESD PROTECTION OPTIMIZER AND AN ESD PROTECTION OPTIMIZATION SYSTEM

(75) Inventors: Gianluca Boselli, Plano, TX (US); Jonathan S. Brodsky, Richardson, TX (US); John E. Kunz, Jr., Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 366 days.

(21) Appl. No.: 12/434,578

(22) Filed: May 1, 2009

(65) Prior Publication Data

US 2010/0169845 A1 Jul. 1, 2010

Related U.S. Application Data

(60) Provisional application No. 61/142,050, filed on Dec. 31, 2008.

(51) Int. Cl.
*G06F 17/50* (2006.01)
*G06F 9/455* (2006.01)

(52) U.S. Cl. ........................................ 716/133; 716/122

(58) Field of Classification Search .......... 716/118–119, 716/122, 132–133
See application file for complete search history.

(56) References Cited

U.S. PATENT DOCUMENTS

| 6,969,903 | B2 * | 11/2005 | Eshun et al. ................. 257/536 |
| 7,089,511 | B2 * | 8/2006 | Allen et al. ................... 716/103 |
| 7,302,378 | B2 * | 11/2007 | Hayashi ......................... 703/14 |
| 7,434,179 | B2 * | 10/2008 | Hayashi ......................... 716/106 |
| 7,512,916 | B2 * | 3/2009 | Hayashi ......................... 716/136 |
| 7,558,720 | B1 * | 7/2009 | Berigei et al. ................. 703/14 |
| 7,890,906 | B2 * | 2/2011 | Chadwick et al. ............. 716/123 |
| 2005/0102644 | A1 * | 5/2005 | Collins et al. ................. 716/11 |
| 2007/0277138 | A1 * | 11/2007 | Lai et al. ......................... 716/12 |
| 2008/0104554 | A1 * | 5/2008 | Kobayashi et al. ............... 716/4 |
| 2009/0019414 | A1 * | 1/2009 | Eshun et al. ..................... 716/11 |
| 2009/0094568 | A1 * | 4/2009 | Shukla et al. ..................... 716/5 |
| 2011/0016440 | A1 * | 1/2011 | Bergmann et al. ............. 716/106 |

OTHER PUBLICATIONS

Boselli, et al.; "A System, an Apparatus and a Method for Performing Chip-Level Electrostatic Discharge Simulations"; U.S. Appl. No. 12/434,573, filed May 1, 2009.
Boselli, et al.; "An ESD Protection Validator, an ESD Validation System and a Method of Validating ESD Protection for an IC", U.S. Appl. No. 12/506,597, filed Jul. 21, 2009.
Boselli, et al.; "An ESD Protection Validator, an ESD Validation System and a Method of Validating ESD Protection for an IC"; U.S. Appl. No. 12/434,581, filed May 1, 2009.

* cited by examiner

*Primary Examiner* — Stacy Whitmore
(74) *Attorney, Agent, or Firm* — Alan A. R. Cooper; Wade James Brady, III; Frederick J. Telecky, Jr.

(57) ABSTRACT

An ESD protection optimizer, a method of optimizing ESD protection for an IC and an ESD protection optimization system is disclosed. In one embodiment, the ESD protection optimizer includes: (1) a circuit analyzer configured to identify ESD cells and circuitry of the IC by comparing component information of the IC with predefined ESD protection elements and predefined circuit topologies and (2) an ESD resistance determiner configured to calculate a resistance value to couple in series with the circuitry, the resistance value based on protection cell physical attributes associated with the identified ESD cells and circuitry physical attributes associated with the identified circuitry.

19 Claims, 4 Drawing Sheets

METHOD OF OPTIMIZING ESD PROTECTION FOR AN IC, AN ESD PROTECTION OPTIMIZER AND AN ESD PROTECTION OPTIMIZATION SYSTEM

CROSS-REFERENCE TO RELATED APPLICATION

This application claims the benefit of U.S. Provisional Application Ser. No. 61/142,050, filed by Gianluca Boselli, et al., on Dec. 31, 2008, entitled "METHOD TO OPTIMIZE AN ELECTROSTATIC DISCHARGE PROTECTION ELEMENT," commonly assigned with this application and incorporated herein by reference. This application is also related to the following U.S. Patent Applications, which are commonly assigned herewith and incorporated herein by reference:

Ser. No. 12/434,573, filed by Boselli, et al. on even date herewith and entitled, "A SYSTEM, AN APPARATUS AND A METHOD FOR PERFORMING CHIP-LEVEL ELECTROSTATIC DISCHARGE SIMULATIONS;" and Ser. No. 12/506,597, filed by Boselli, et al. on even date herewith and entitled, "AN ESD PROTECTION VALIDATOR, AN ESD VALIDATION SYSTEM AND A METHOD OF VALIDATING ESD PROTECTION FOR AN IC."

TECHNICAL FIELD

This application is directed, in general, to protecting integrated circuits (ICs) from electrostatic discharges (ESD) and, more specifically, to optimizing ESD protection for an IC.

BACKGROUND

ESD is the transfer of an electrostatic charge between two objects (e.g., electronic devices) of different electric potential. In the semiconductor industry, ESD is one of the leading causes of IC failure and becomes an even greater problem as dimensions decrease to meet the demand for higher operating speed and device density and lower operating voltages and cost.

Semiconductor manufacturers may require their products to pass an ESD qualification test before being released to customers to ensure that the ESD protection exists and meets applicable requirements. To determine the existence and compliance of ESD protection, engineers may examine each product's schematic and layout.

SUMMARY

One aspect provides an ESD protection optimizer. In one embodiment, the ESD protection optimizer includes: (1) a circuit analyzer configured to identify ESD cells (i.e., ESD protection cells) and circuitry of the IC by comparing component information of the IC with predefined ESD protection elements and predefined circuit topologies and (2) an ESD resistance determiner configured to calculate a resistance value to couple in series with the circuitry, the resistance value based on protection cell physical attributes associated with the identified ESD cells and circuitry physical attributes associated with the identified circuitry.

In another aspect, a method of optimizing ESD protection for an IC is provided. In one embodiment, the method includes: (1) identifying ESD cells and circuitry of the IC, (2) calculating a resistance value to couple in series with the circuitry based on protection cell physical attributes associated with the identified ESD cells and circuitry physical attributes associated with the identified circuitry and (3) providing the calculated resistance value to couple in series with the identified circuitry.

In yet another aspect, an ESD protection optimization system is disclosed. In one embodiment, the ESD protection optimization system includes: (1) a predefined ESD protection element database configured to store technology-independent topologies of ESD protection elements wherein each of the topologies has a defined set of attributes for each pair of terminals thereof, (2) an ESD protection element attributes database configured to store technology-dependent protection cell physical attributes associated with the ESD protection elements (3) a predefined circuit database configured to store technology-independent topologies of circuitry wherein each of the topologies has a defined set of attributes for each pair of terminals thereof, (4) a circuit attributes database configured to store technology-dependent circuitry physical attributes associated with the circuitry topologies and (5) an ESD protection optimizer, having: (5A) a circuit analyzer configured to identify ESD cells and circuitry of the IC by comparing component information of the IC with the topologies of the predefined ESD protection elements and the predefined circuit topologies and (5B) an ESD resistance determiner configured to calculate a resistance value to place in series with the circuitry, the resistance value based on the protection cell physical attributes associated with the identified ESD cells and the circuitry physical attributes associated with the identified circuitry.

BRIEF DESCRIPTION

Reference is now made to the following descriptions taken in conjunction with the accompanying drawings, in which.

DETAILED DESCRIPTION

As stated above, engineers may examine each product's schematic and layout to determine the existence and compliance of ESD protection. Typically, this examination process to verify the existence of ESD protection is manual and therefore can be tedious and time-consuming. As such, determining how to improve existing ESD protection can also be tedious and time-consuming.

The disclosure relates to automated optimization of ESD protection for pins of an IC. Optimization of the ESD protection for an IC may include the determination of a resistance value (e.g., a limiting resistor) to be placed in series with the protected topology/component (e.g., circuitry) as a function of an ESD cell associated with the circuitry and ESD targets (i.e., ESD requirements). The resistance value may be a limiting resistor that is used to limit ESD current that flows into the core circuitry of an IC that is being protected by the ESD cell.

The disclosure, therefore, provides automated optimization of ESD protection for an IC at the design stage. Component information for an IC design (i.e., the IC) may be obtained from a schematic and layout of the IC. The IC component information may include the elements and describe the connectivity of the IC. A netlist from the IC's schematic and layout may be used to provide the IC component information. The netlist can be used to identify ESD cells and circuitry of the IC and determine if pins of the IC coupled to the circuitry are also coupled to an ESD cell.

The component information can be compared to predefined ESD protection elements and predefined circuits to identify circuitry and ESD cells for the circuitry. Multiple ESD cells in an ESD protection path coupled to the circuitry can be collapsed into a single ESD cell having associated physical attributes based on the connection of the multiple ESD cells and the physical attributes associated with each of the multiple ESD cells in the ESD protection path.

Since the physical attributes for both the ESD cells and the circuitry are physical numbers, the KCL/KVL for the combination ESD cell and circuitry can be resolved. The resistance, therefore, needed to couple in series with the circuitry can be calculated. Thus, instead of using ESD Spice simulations to determine a needed resistance, resistance can be calculated. A report can be generated to indicate the calculated resistance values to couple in series with the circuitry between pin-pairs of the IC.

Figure 1:
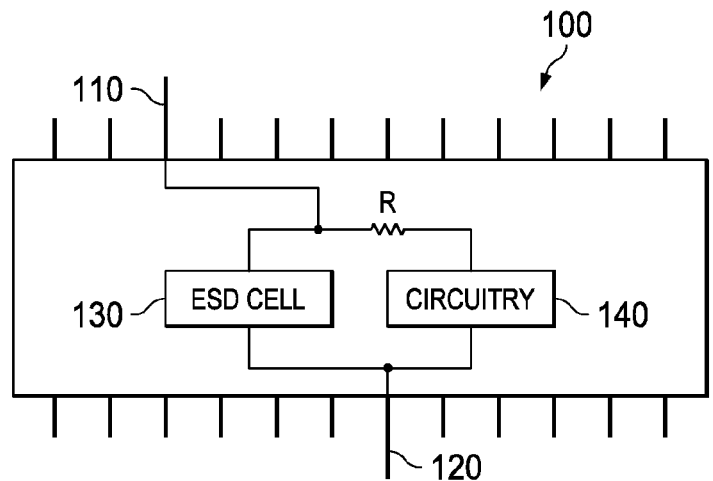
FIG. 1 is a block diagram of an IC having a plurality of pins.

The physical attributes associated with the circuitry and the ESD cells are for ESD conditions according to known ESD protection requirements. The known requirements can be design and pin requirements for a desired IC. The requirements may vary per design and for the pins. The requirements can include voltage, power, load, etc. The known requirements can also include ESD protection requirements for a particular design or manufacturing node. The ESD protection requirements may be based on known manufacturing or industry standards. FIG. 1 provides an example of an IC having circuitry coupled to an ESD cell that may be optimized according to the principles of this disclosure.

FIG. 1 is a block diagram of an IC 100 having a plurality of pins. The pins are conducting components that provide internal access to and external access for the IC 100. The pins may be referred to as external conductive extrusions. ESD cells are coupled to the plurality of pins to provide ESD protection for circuitry coupled to the pins. Pins 110 and 120 are denoted to represent the plurality of pins. Additionally, ESD cell 130, circuitry 140 and resistance R are illustrated to represent ESD protection, the circuitry of the IC that is protected from ESD events by the ESD cell 130 and resistance that is placed in series with the circuitry to limit the current through said circuitry during ESD events, for example, a field induced charge.

For example, the ESD cell 130 may include suppression components that protect the circuitry 140 coupled between the pins 110, 120, from an ESD voltage. The compression components may clamp the ESD voltage to an appropriate level that the circuitry 140 can survive. Connected in parallel with the circuitry 140, the ESD cell 130 can clamp the ESD voltage and shunt at least a majority of the ESD current away from the circuitry 140 to an appropriate dissipation reference. The resistance R can be a limiting resistor that is added to the IC to provide further protection for the circuitry 140 against ESD by limiting ESD current that could flow along the path including the circuitry 140.

Figure 2:
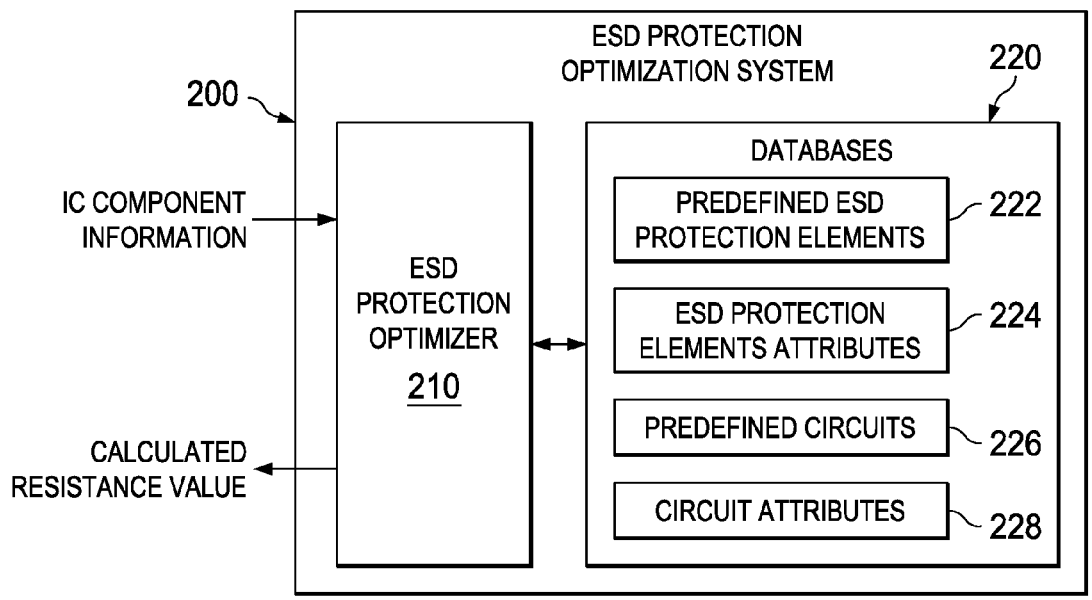
FIG. 2 is a block diagram of an embodiment of an ESD protection optimization system constructed according to the principles of the disclosure.

FIG. 2 is a block diagram of an embodiment of an ESD protection optimization system 200 constructed according to the principles of the disclosure. The ESD validation system 210 includes an ESD protection optimizer 210 and ESD protection databases 220. The databases 220 include a database for predefined ESD protection elements 222, ESD protection element attributes 224, predefined circuits 226 and circuit attributes 228. Each database of the databases 220 may be a conventional database.

The ESD protection optimizer 210 is configured to optimize ESD protection for an IC. The ESD protection optimizer 210 may calculate a limiting resistance value to optimize the ESD protection for the IC. In one embodiment, the ESD protection optimizer 210 is configured to optimize ESD protection for an IC based on component information of the IC, predefined ESD protection element topologies, ESD protection element physical attributes associated with the predefined ESD protection element topologies, predefined circuit topologies and circuitry physical attributes associated with the predefined circuit topologies. The component information for the IC may be obtained from the schematic and the layout of the IC. In one embodiment, the IC component information is obtained from a netlist generated from the schematic and layout.

The ESD protection optimizer 210 or at least a portion thereof may be embodied as a series of operating instructions stored on a computer readable storage medium that directs the operation of a processor when executed thereby. In one embodiment the ESD protection optimizer 210 may be a dedicated computing-device having the necessary circuitry to perform the functions described herein. An embodiment of an ESD protection optimizer is discussed in more detail with respect to FIG. 3.

The predefined ESD protection element database 222 is configured to store technology-independent topologies of ESD protection elements. The topologies represent the physical and logical structure of ESD protection elements. The topologies may represent the ESD protection elements as n-terminal "black boxes" having any m components connected between the n terminals in any given fashion. For example, a topology may have two, three, four or more terminals. The terminals may be reference terminals, power terminals, input terminal, etc. Each of the topologies of the ESD protection elements has a defined set of attributes for each pair of terminals of the topologies. The stored topologies, therefore, represent known ESD protection elements.

The ESD protection element attributes database 224 is configured to store technology-dependent physical attributes associated with the ESD protection elements. The technology-dependent attributes includes attributes that are terminal-independent. The terminal-independent attributes may include (but are not limited to) applications for the associated ESD protection element, fail-safe/non-fail-safe, powered-off (yes/no), mask levels used, ESD performance and maximum allowed dV/dt (V/sec). The attributes included in the ESD protection element attributes database 224 may also include terminal-dependent attributes for ESD protection components. The terminal dependent attributes may include (but not limited to) Vtdc, Vt1, Vsp and Ron. Additional parameters may be included to build an ESD condition model of the ESD protection elements.

The predefined circuits database 226 is configured to store topologies of circuitry wherein each of the topologies has a defined set of attributes for each pair of terminals thereof. The topologies represent the physical and logical structure of circuitry in the IC. The topologies may represent the circuitry as n-terminal "black boxes" having any m components connected between the n terminals in any given fashion. For example, a topology may have two, three, four or more terminals. The terminals may correspond to pins of the IC and can be reference terminals, power terminals, input terminals, etc. The stored topologies represent known circuitry having technology-independent topologies with a defined set of rules for setting global attributes based on the component attributes and for ESD requirements based on topology and ESD cell and path attributes.

The circuit attributes database 228 is configured to store circuitry physical attributes associated with the circuitry topologies. The technology-dependent attributes includes attributes that are assigned to each two-terminal combination of the circuitry topologies. The physical attributes may include (but not limited to): Vt1nobias (i.e., triggering voltage of a parasitic element within the topology under no bias conditions), Vt1 (i.e., triggering voltage of the parasitic element within the topology under specific bias conditions); It1nobias (i.e., triggering current of the parasitic element within the topology under no bias conditions), It1 (i.e., triggering current of the parasitic element within the topology under specific bias conditions); Vsp (i.e., sustaining voltage of the parasitic element within the topology); Ron (i.e., on-resistance of the parasitic element within the topology); It2 (i.e., maximum sustaining current of the parasitic element within the topology); and Wfmax (i.e., maximum effective gate width associated to the parasitic element within the topology).

Figure 3:
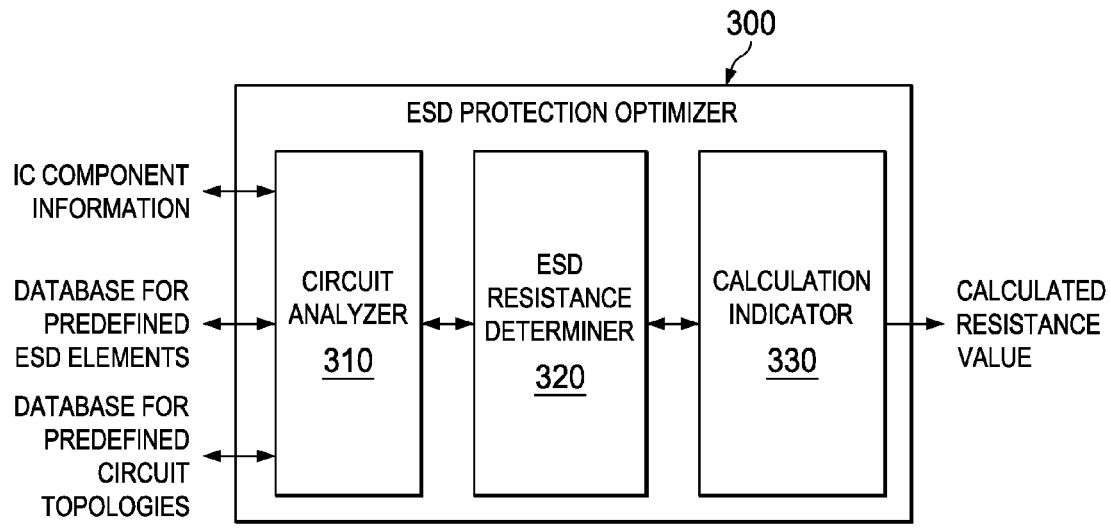
FIG. 3 is a block diagram of an embodiment of an ESD protection optimizer constructed according to the principles of the disclosure.

FIG. 3 is a block diagram of an embodiment of an ESD protection optimizer 200 constructed according to the principles of the disclosure. The ESD protection optimizer 200 includes a circuit analyzer 310, an ESD resistance determiner 320 and a calculation indicator 330.

The circuit analyzer 310 is configured to identify ESD cells and circuitry of the IC by comparing component information of the IC with predefined ESD protection elements and predefined circuit topologies. The component information used by the circuit analyzer 310 may be obtained from a netlist of the IC. The circuit analyzer 310 may employ a pattern matching engine to compare the IC component information with the predefined ESD protection elements and the predefined circuit topologies to determine the identified ESD cells and the identified circuitry.

The ESD resistance determiner 320 is configured to calculate a resistance value to couple in series with the circuitry. The ESD resistance determiner 320 may calculate the resistance value based on protection cell physical attributes associated with the identified ESD cells and circuitry physical attributes associated with the identified circuitry. Additionally, the ESD resistance determiner 320 is configured to associate the protection cell physical attributes to the identified ESD cells and the circuitry physical attributes to the identified circuitry. The protection cell physical attributes and the circuitry physical attributes may be predetermined parameters for ESD conditions assigned to each terminal pair of the identified ESD cells and the identified circuitry. In one embodiment, the ESD resistance determiner 320 is further configured to identify ESD paths between each terminal pair of the identified circuitry. The ESD resistance determiner 320 may then collapse each of the ESD paths into a single ESD component having combined physical attributes based on the protection cell physical attributes associated with the identified ESD cells of each of the ESD paths.

Figure 4A:
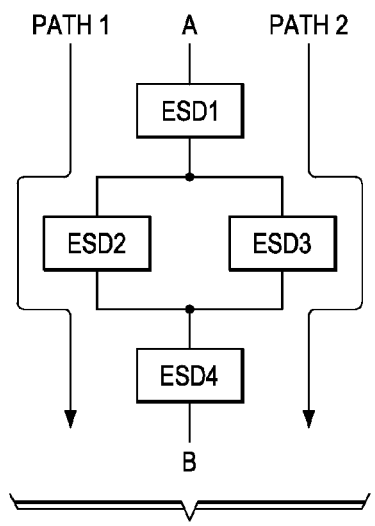
FIGS. 4A and 4B illustrate multiple ESD protection paths between terminal pairs of IC circuitry.
Figure 4B:
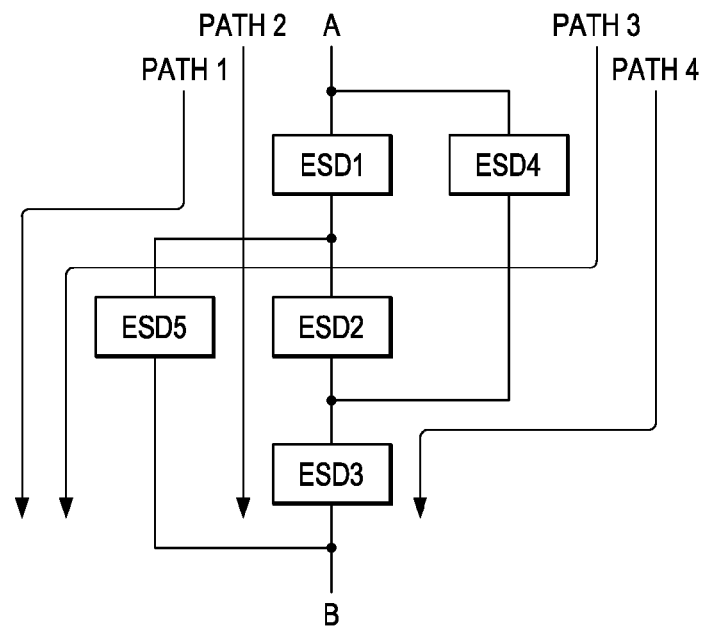

For example, consider FIGS. 4A and 4B illustrate multiple paths of ESD cells between the terminals A and B of predefined circuits identified in an IC. Each of the paths is identified and then each path is collapsed into a single representative ESD cell. The single representative ESD cells of each path can then be combined into one ESD cell that represents the ESD protection between the terminals of an IC circuit. The ESD paths may be collapsed in stages with a pair of ESD cells combined at a time.

Figure 5A:
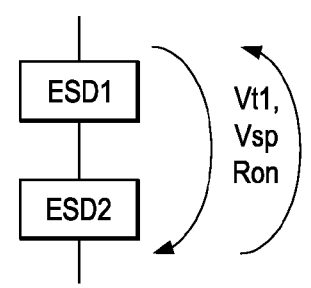
FIGS. 5A and 5B illustrate ESD cells in series and in parallel.
Figure 5B:
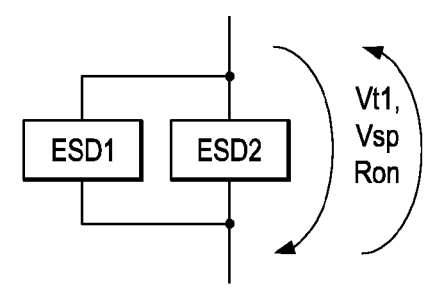

FIGS. 5A and 5B illustrate ESD cells of a path, such as between terminals A and B, that can be combined. FIG. 5A illustrates two ESD cells, $ESD_1$ and $ESD_2$, that are coupled in series. Also illustrated are terminal dependent attributes Vt1, Vsp and Ron, that represent the sum of the two ESD cells, $ESD_1$ and $ESD_2$. The attributes may be determined using the following equations:

$$Vt1 = Vt1_1 + Vt1_2 \qquad \text{Equation 1}$$

$$Vsp = Vsp_1 + Vsp_2 \qquad \text{Equation 2}$$

$$Ron = Ron_1 + Ron_2 \qquad \text{Equation 3.}$$

FIG. 5B illustrates two ESD cells, $ESD_1$ and $ESD_2$, that are coupled in parallel. The terminal dependent attributes Vt1, Vsp and Ron and also included. When combining parallel ESD cells, the following equations may be used:

$$Vt1 = \text{Lessor of } (Vt1_1, Vt1_2) \qquad \text{Equation 4}$$

$$Vsp = Vsp \text{ of ESD cell selected for Vt1} \qquad \text{Equation 5}$$

$$Ron = Ron \text{ of ESD cell selected for Vt1} \qquad \text{Equation 6.}$$

Figure 6:
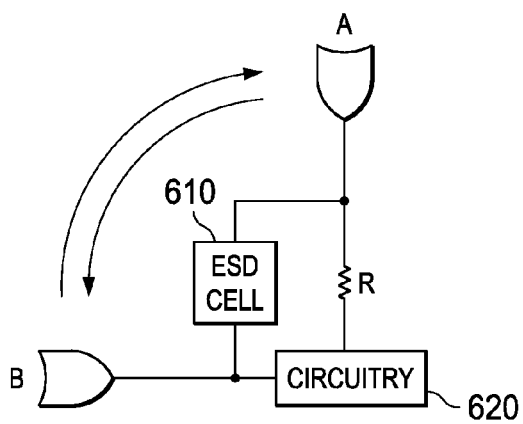
FIG. 6 illustrates a circuit representing a single ESD protection component between terminal pairs of IC circuitry.

FIG. 6 illustrates the circuitry between two terminals of an IC circuit after the multiple paths have been collapsed. The ESD cell 610 represents the collapsed ESD protection between terminals A and B of an IC circuitry 620. The ESD resistance determiner 320 may calculate the limiting resistance R to place in series with the circuitry 620. In one embodiment, the ESD resistance determiner 320 may employ the following equations to determine the resistance value:

$$R_{AB} = \max\{R_{SERIES\_1}; R_{SERIES\_2}\} \qquad \text{Equation 7}$$

$$R_{SERIES\_1} = \frac{(V_{T1\_ESD} - V_{SP\_PROT}) - (R_{ON\_PROT\_NORM} \cdot I_{T2\_PROT\_NORM})}{I_{T2\_PROT\_NORM} \cdot W_{PROT}} \qquad \text{Equation 8}$$

$$R_{SERIES\_2} = \frac{(V_{SP\_ESD} - V_{SP\_PROT}) + (R_{ON\_ESD} + R_{BUS}) \cdot I_{ESD\_TARG}}{I_{T2\_PROT\_NORM} \cdot W_{PROT}} - \left(R_{ON\_ESD} + R_{BUS} + \frac{R_{ON\_PROT\_NORM}}{W_{PROT}}\right). \qquad \text{Equation 9}$$

In Equations 8-9:
$V_{T1\_ESD}$: is triggering voltage of the ESD cell;
$V_{SP\_PROT}$: is sustaining voltage of the protected topology;
$R_{ON\_PROT\_NOR}$: is the on-resistance normalized per unit of width of the protected topology;
$I_{T2\_PROT\_NCRM}$: is the maximum sustaining current per unit of width of the protected topology;
$W_{PROT}$: is width of the protected topology;
$V_{SD\_ESD}$: is the sustaining voltage of the ESD cell;
$R_{ON\_ESD}$: is the on resistance of the ESD cell;
$R_{BUS}$: is the parasitic metal resistance in the ESD path; and
$I_{ESD\_TARG}$: is the ESD current target for the given application.

The calculation indicator 330 is configured to provide the calculated resistance value (e.g., $R_{AB}$). The calculation indicator 330 may generate electrical signals to represent the calculated resistance value. The calculation indicator 330 may include a display that employs the generated electrical signals to display the calculated resistance value. Additionally, the calculation indicator 330 may use the generated electrical signals to cause the calculated resistance value to be printed.

Figure 7:
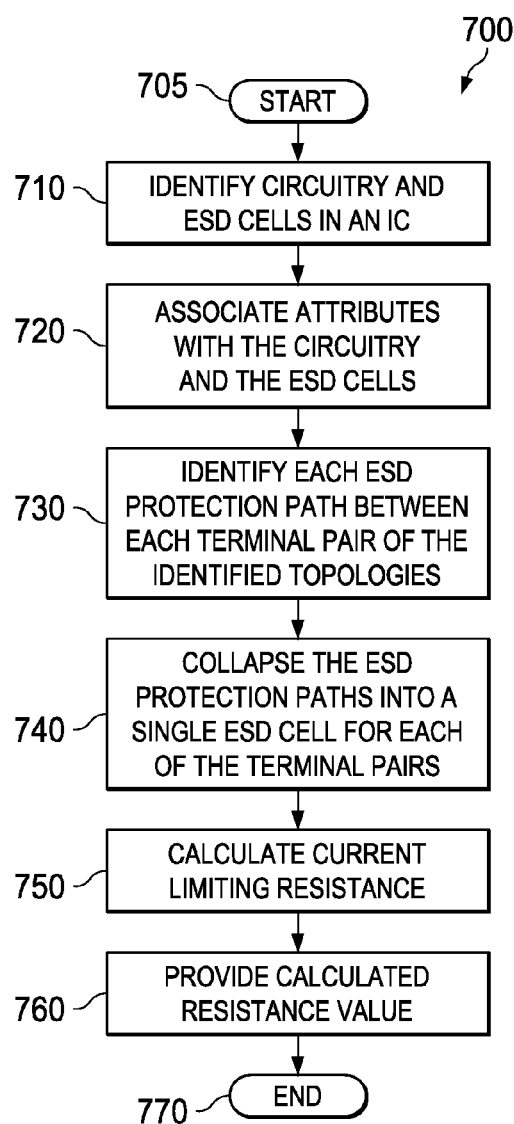
FIG. 7 is a flow diagram of an embodiment of a method of optimizing ESD protection for an IC according to the principles of the disclosure.

FIG. 7 is a flow diagram of an embodiment of a method 700 of optimizing ESD protection for an IC according to the principles of the disclosure. The method 700 may be implemented as a series of computer executable instructions, stored on a computer-readable storage medium, that direct the operation of a processor when executed. In one embodiment, the method 700 may be performed by a dedicated computer specifically programmed for executing the steps thereof. The method 700 begins in a step 705.

In a step 710, circuitry and ESD cells of an IC are identified. The circuitry and the ESD cells of the IC may be identified using a predefined ESD protection element database, a predefined circuits database and a pattern matching engine. The pattern matching engine can compare IC component information to ESD protection elements and circuit topologies of the databases to identify ESD cells and circuitry of the IC. The IC component information may be from a netlist a schematic and layout of the IC. Thus, the pattern matching engine may be configured to compare and match an input string from the IC component information to a group of predefined string patterns representing predefined or known ESD protection elements and predefined or known circuit topologies.

After identifying the circuitry and the ESD cells of the IC, physical attributes are associated with the identified circuitry and the identified ESD cells in a step 720. Protection cell physical attributes may be associated by identifying attributes in an ESD protection element attributes database that are designated for specific ESD protection elements such as the identified ESD protection elements. Circuitry physical attributes may be associated by identifying attributes in a circuit attributes database that are designated for specific circuits such as the identified circuitry.

The method 700 continues where ESD protection paths between each terminal pair of the identified circuitry are identified in a step 730. Multiple ESD protection paths may be identified between terminal pairs of the identified circuitry. Each of the ESD protection paths may include a plurality of ESD cells.

Each of the ESD paths is collapsed into a single ESD protection component for the terminal pairs of the circuitry in a step 740. The single ESD protection components have combined physical attributes based on the protection cell physical attributes associated with the identified ESD cells of each of the ESD paths collapsed.

In a step 750, a resistance value is calculated to couple in series with the circuitry. The resistance value to couple in series with each circuitry is calculated based on the combined physical attributes associated with the single ESD protection components and the circuitry physical attributes associated with the identified circuitry that is being protected by each of the single ESD protection components. As such, the resistance value is a function of the single ESD protection components and the identified circuitry.

After calculating the resistance value, the calculated resistance value is provided in a step 760. The method 700 then continues to step 770 and ends.

The above-described system and methods may be embodied in or performed by various conventional digital data processors or computers, wherein the computers are programmed or store executable programs of sequences of software instructions to perform one or more of the steps of the methods, e.g., steps of the method of FIG. 7. The software instructions of such programs may be encoded in machine-executable form on conventional digital data storage media, e.g., magnetic or optical disks, random-access memory (RAM), magnetic hard disks, flash memories, and/or read-only memory (ROM), to enable various types of digital data processors or computers to perform one, multiple or all of the steps of one or more of the above-described methods, e.g., one or more of the steps of the method of FIG. 7. Additionally, a dedicated apparatus or a system, such as, an ESD protection optimizer or and ESD protection optimization system, may be designed to include the necessary circuitry to perform each step of the method of FIG. 7.

Those skilled in the art to which this application relates will appreciate that other and further additions, deletions, substitutions and modifications may be made to the described embodiments.

What is claimed is:

1. An electrostatic discharge (ESD) protection optimizer for an integrated circuit (IC) comprising:
   a series of operating instructions stored on a computer readable storage medium that directs an operation of a processor when executed thereby, the instructions including:
      a circuit analyzer configured to identify ESD cells and circuitry of said IC by comparing component information of said IC with predefined ESD protection elements and predefined circuit topologies; and
      an ESD resistance determiner configured to calculate a resistance value to couple in series with said circuitry, said resistance value based on protection cell physical attributes associated with said identified ESD cells and circuitry physical attributes associated with said identified circuitry,
   wherein said ESD resistance determiner is further configured to identify ESD protection paths between the at least one terminal pair of said identified circuitry; and
   wherein said ESD resistance determiner is further configured to collapse each of said ESD protection paths into a single ESD component having combined physical attributes based on said protection cell physical attributes associated with said identified ESD cells of said each of said ESD protection paths.

2. The ESD protection optimizer as recited in claim 1 wherein said ESD resistance determiner is further configured to associate said protection cell physical attributes to said identified ESD cells and said circuitry physical attributes to said identified circuitry.

3. The ESD protection optimizer as recited in claim 2 wherein said protection cell physical attributes and said circuitry physical attributes are predetermined parameters for ESD conditions assigned to at least one terminal pair of said identified ESD cells and said identified circuitry.

4. The ESD protection optimizer as recited in claim 1 further comprising a calculation indicator configured to provide said calculated resistance value.

5. The ESD protection optimizer as recited in claim 1 wherein said IC component information is obtained from a netlist of said IC.

6. The ESD protection optimizer as recited in claim 1 wherein said circuit analyzer is configured to employ a pattern matching engine to compare said IC component information with said predefined ESD protection elements and said predefined circuit topologies to determine said identified ESD cells and said identified circuitry.

7. A method of optimizing electrostatic discharge (ESD) protection for an integrated circuit (IC), comprising:
identifying ESD cells and circuitry of said IC;
calculating a resistance value to couple in series with said circuitry based on protection cell physical attributes associated with said identified ESD cells and circuitry physical attributes associated with said identified circuitry;
providing said calculated resistance value to couple in series with said identified circuitry; and
collapsing each of said ESD protection paths into a single ESD component having combined physical attributes based on said protection cell physical attributes associated with said identified ESD cells of said each of said ESD protection paths,
wherein said identifying, calculating, providing and collapsing are performed with employment of a series of operating instructions stored on a computer readable storage medium that directs an operation of a processor when executed thereby.

8. The method as recited in claim 7 further comprising associating said protection cell physical attributes to said identified ESD cells and said circuitry physical attributes to said identified circuitry.

9. The method as recited in claim 8 wherein said protection cell physical attributes and said circuitry physical attributes are predetermined parameters for ESD conditions assigned to at least one terminal pair of said identified ESD cells and said identified circuitry.

10. The method as recited in claim 7 further comprising identifying ESD protection paths between the at least one terminal pair of said identified circuitry.

11. The method as recited in claim 7 wherein said providing includes generating an electronic signal representing said calculated resistance value.

12. The method as recited in claim 7 wherein said identifying includes comparing IC component information of said IC to predefined ESD protection elements and predefined circuit topologies to determine said identified predefined ESD cells and said identified circuitry.

13. The method as recited in claim 12 wherein said IC component information is obtained from a netlist of said IC.

14. An electrostatic discharge (ESD) protection optimization system for integrated circuits (ICs) comprising:
a predefined ESD protection element database configured to store technology-independent topologies of ESD protection elements wherein each of said topologies has a defined set of attributes for each pair of terminals thereof;
an ESD protection element attributes database configured to store technology-dependent protection cell physical attributes associated with said ESD protection elements;
a predefined circuit database configured to store technology-independent topologies of circuitry wherein each of said topologies has a defined set of attributes for each pair of terminals thereof;
a circuit attributes database configured to store technology-dependent circuitry physical attributes associated with said circuitry topologies; and
an ESD protection optimizer having a series of operating instructions stored on a computer readable storage medium that directs an operation of a processor when executed thereby, the instructions including:
a circuit analyzer configured to identify ESD cells and circuitry of said IC by comparing component information of said IC with said topologies of said predefined ESD protection elements and said predefined circuit topologies, and
an ESD resistance determiner configured to calculate a resistance value to place in series with said circuitry, said resistance value based on said protection cell physical attributes associated with said identified ESD cells and said circuitry physical attributes associated with said identified circuitry,
wherein said ESD resistance determiner is further configured to collapse each of said ESD protection paths into a single ESD component having combined physical attributes based on said protection cell physical attributes associated with said identified ESD cells of said each of said ESD protection paths.

15. The ESD protection optimization system as recited in claim 14, wherein said ESD resistance determiner is further configured to associate said protection cell physical attributes to said identified ESD cells and said circuitry physical attributes to said identified circuitry.

16. The ESD protection optimization system as recited in claim 15 wherein said ESD resistance determiner is configured to identify ESD protection paths between at least one terminal pair of said identified circuitry.

17. The ESD protection optimization system as recited in claim 14, wherein said ESD protection optimizer further includes a calculation indicator configured to rovide an electrical signal representing said calculated resistance value.

18. The ESD protection optimization system as recited in claim 14, wherein said protection cell physical attributes and said circuitry physical attributes are predetermined parameters for ESD conditions assigned to at least one terminal pair of said identified ESD cells and said identified circuitry.

19. The ESD protection optimization system as recited in claim 14, wherein said circuit analyzer is configured to employ a pattern matching engine to compare said IC component information with said predefined ESD protection elements and said predefined circuit topologies to determine said identified ESD cells and said identified circuitry.

* * * * *